United States Patent
Kido et al.

(10) Patent No.: US 12,267,059 B2
(45) Date of Patent: Apr. 1, 2025

(54) ACOUSTIC WAVE DEVICE

(71) Applicant: Murata Manufacturing Co., Ltd., Nagaokakyo (JP)

(72) Inventors: Syunsuke Kido, Nagaokakyo (JP); Tetsuya Kimura, Nagaokakyo (JP); Sho Nagatomo, Nagaokakyo (JP); Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 299 days.

(21) Appl. No.: 17/946,574

(22) Filed: Sep. 16, 2022

(65) Prior Publication Data
US 2023/0015397 A1   Jan. 19, 2023

Related U.S. Application Data

(63) Continuation of application No. PCT/JP2021/010887, filed on Mar. 17, 2021.

(30) Foreign Application Priority Data

Mar. 18, 2020   (JP) ................. 2020-047890

(51) Int. Cl.
*H03H 9/02* (2006.01)
*H03H 9/13* (2006.01)
*H03H 9/56* (2006.01)

(52) U.S. Cl.
CPC .... *H03H 9/02228* (2013.01); *H03H 9/02015* (2013.01); *H03H 9/13* (2013.01); *H03H 9/568* (2013.01)

(58) Field of Classification Search
CPC .......... H03H 9/02228; H03H 9/02015; H03H 9/02157; H03H 9/174; H03H 9/02031;
(Continued)

(56) References Cited

U.S. PATENT DOCUMENTS 6,346,761 B1    2/2002  Isobe et al.
2010/0223999 A1*  9/2010  Onoe ................. H03H 9/02622
                                                          73/579
(Continued)

FOREIGN PATENT DOCUMENTS

JP    H11136081 A    5/1999
JP    2000286663 A   10/2000
(Continued)

OTHER PUBLICATIONS

International Search Report in PCT/JP2021/010887, mailed May 11, 2021, 5 pages.
(Continued)

*Primary Examiner* — Lincoln D Donovan
*Assistant Examiner* — Tyler J Pereny
(74) *Attorney, Agent, or Firm* — Keating & Bennett, LLP

(57) ABSTRACT

An acoustic wave device includes a piezoelectric layer that is made of lithium niobate or lithium tantalate, and a plurality of pairs of electrodes opposed to each other in a direction intersecting with a thickness direction of the piezoelectric layer, in which a bulk wave in a thickness shear primary mode is used or d/p is about 0.5 or lower when a thickness of the piezoelectric layer is d and a distance between centers of mutually adjacent electrodes among the plurality of pairs of electrodes is p. The plurality of pairs of electrodes include at least one pair of first electrodes of a first acoustic wave resonator and at least one pair of second electrodes of a second acoustic wave resonator. A direction orthogonal to a longitudinal direction of the second electrodes in the second acoustic wave resonator is inclined at an angle that is greater than 0° and smaller than 360° with respect to a direction orthogonal to a longitudinal direction of the first electrodes in the first acoustic wave resonator.

31 Claims, 13 Drawing Sheets

(58) Field of Classification Search
CPC ........ H03H 9/132; H03H 9/568; H03H 9/173;
H03H 9/175; H03H 9/02062; H03H
9/176; H03H 9/205; H03H 9/564; H03H
9/13; H03H 9/02086; H03H 9/02559;
H03H 9/25; H03H 9/02102; H03H 9/131;
H03H 9/02574; H03H 9/17; H03H 9/562;
H03H 3/02; H03H 9/0211; H03H
9/02133; H03H 9/1035; H03H 9/133;
H03H 9/14541; H03H 9/605; H03H
9/02992; H03H 9/0514; H03H 9/14594;
H03H 9/6483; H03H 9/725
See application file for complete search history.

(56) References Cited

U.S. PATENT DOCUMENTS

| | | |
|---|---|---|
| 2013/0057360 A1 | 3/2013 | Meltaus et al. |
| 2013/0127566 A1 | 5/2013 | Iwaki et al. |
| 2014/0152145 A1 | 6/2014 | Kando et al. |
| 2016/0118956 A1 | 4/2016 | Kihara et al. |
| 2019/0149129 A1* | 5/2019 | Ueda ................. H03H 3/10 |
| | | 333/186 |
| 2020/0067489 A1 | 2/2020 | Takata |
| 2020/0220518 A1* | 7/2020 | Omura ................. H03H 9/132 |
| 2022/0069803 A1 | 3/2022 | Nozoe |

FOREIGN PATENT DOCUMENTS

| | | |
|---|---|---|
| JP | 2010233210 A | 10/2010 |
| JP | 2012257019 A | 12/2012 |
| JP | 2013110595 A | 6/2013 |
| JP | 2013528996 A | 7/2013 |
| WO | 2012073871 A1 | 6/2012 |
| WO | 2015002047 A1 | 1/2015 |
| WO | 2018225650 A1 | 12/2018 |
| WO | 2019065666 A1 | 4/2019 |
| WO | 2020130128 A1 | 6/2020 |

OTHER PUBLICATIONS

Written Opinion in PCT/JP2021/010887, mailed May 11, 2021, 7 pages.

* cited by examiner

ACOUSTIC WAVE DEVICE

CROSS REFERENCE TO RELATED APPLICATIONS

This application claims the benefit of priority to Japanese Patent Application No. 2020-047890 filed on Mar. 18, 2020 and is a Continuation Application of PCT Application No. PCT/JP2021/010887 filed on Mar. 17, 2021. The entire contents of each application are hereby incorporated herein by reference.

BACKGROUND OF THE INVENTION

1. Field of the Invention

The present invention relates to an acoustic wave device that includes a piezoelectric layer made of lithium niobate or lithium tantalate.

2. Description of the Related Art

An acoustic wave device that uses plate waves propagating through a piezoelectric film made of $LiNbO_3$ or $LiTaO_3$ is conventionally known. For example, Japanese Unexamined Patent Application Publication No. 2012-257019 discloses an acoustic wave device using Lamb waves serving as plate waves. In this acoustic wave device, an IDT electrode is provided on an upper surface of a piezoelectric film made of $LiNbO_3$ or $LiTaO_3$. A voltage is applied between a plurality of electrode fingers that are connected to one potential of the IDT electrode and a plurality of electrode fingers that are connected to the other potential. Consequently, Lamb waves are excited. Reflectors are provided on both sides of this IDT electrode. An acoustic wave resonator using plate waves is thus configured.

SUMMARY OF THE INVENTION

To realize downsizing of the acoustic wave device described in Japanese Unexamined Patent Application Publication No. 2012-257019, reduction in the number of electrode fingers can be considered. However, the reduction in the number of electrode fingers lowers a Q value.

Also, when a band pass filter is configured by using a plurality of pieces of acoustic wave resonators described above, spurious is generated in other than a main mode to be used, sometimes degrading filter characteristics.

Preferred embodiments of the present invention provide acoustic wave devices that each realize an increase in a Q value even when downsized and attain reduction in spurious in filter characteristics.

A first preferred embodiment of the present invention provides an acoustic wave device including a piezoelectric layer that is made of lithium niobate or lithium tantalate, and a plurality of pairs of electrodes opposed to each other in a direction intersecting with a thickness direction of the piezoelectric layer, in which a bulk wave in a thickness shear primary mode is used, the plurality of pairs of electrodes include at least one pair of first electrodes of a first acoustic wave resonator and at least one pair of second electrodes of a second acoustic wave resonator, and a direction orthogonal to a longitudinal direction of the second electrodes in the second acoustic wave resonator is inclined at an angle that is greater than 0° and smaller than 360° with respect to a direction orthogonal to a longitudinal direction of the first electrodes in the first acoustic wave resonator.

A second preferred embodiment of the present invention provides an acoustic wave device including a piezoelectric layer that is made of lithium niobate or lithium tantalate, and a plurality of pairs of electrodes opposed to each other in a direction intersecting with a thickness direction of the piezoelectric layer, in which d/p is about 0.5 or lower when a thickness of the piezoelectric layer is d and a distance between centers of mutually adjacent electrodes among the plurality of pairs of electrodes is p, the plurality of pairs of electrodes include at least one pair of first electrodes of a first acoustic wave resonator and at least one pair of second electrodes of a second acoustic wave resonator, and a direction orthogonal to a longitudinal direction of the second electrodes in the second acoustic wave resonator is inclined at an angle that is greater than 0° and smaller than 360° with respect to a direction orthogonal to a longitudinal direction of the first electrodes in the first acoustic wave resonator.

In an acoustic wave device according to a preferred embodiment of the present invention, a Q value can be increased even when downsizing of the acoustic wave device is promoted, and spurious appearing in filter characteristics can be reduced and degradation in filter characteristics can be thus reduced or prevented when the acoustic wave device defines a filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the accompanying drawings.

It should be noted that each of the preferred embodiments described in the present specification is exemplary and that a configuration can be partially replaced or combined with another configuration between different preferred embodiments.

In an acoustic wave device according to a preferred embodiment of the present invention, 1) a Q value can be increased even when the acoustic wave device is downsized, and 2) spurious can be reduced and degradation in filter characteristics can be reduced or prevented when the acoustic wave device defines a filter. The advantageous effects mentioned above can be obtained because the following configurations are provided in the first and second preferred embodiments of the present invention.

The first and second preferred embodiments of the present invention include a piezoelectric layer made of lithium niobate or lithium tantalate and a plurality of pairs of electrodes that are opposed to each other in a direction intersecting with a thickness direction of the piezoelectric layer. The first preferred embodiment of the present invention uses bulk waves in a thickness shear primary mode.

In the second preferred embodiment of the present invention, when the thickness of the piezoelectric layer is d and a distance between centers of mutually adjacent electrodes is p, d/p is about 0.5 or lower. A Q value can be increased by mutually adjacent electrodes even in promoting downsizing, in the first and second preferred embodiments of the present invention.

In a preferred embodiment of the present invention, a piezoelectric layer and a plurality of pairs of electrodes are provided, and the plurality of pairs of electrodes define first and second acoustic wave resonators. The inventors of the present application have discovered that a Q value can be increased in the case where bulk waves in the thickness shear primary mode are used or in the case where d/p is about 0.5 or lower when the thickness of a piezoelectric layer is d and a distance between centers of mutually adjacent electrodes is p, in the acoustic wave resonators mentioned above. This will be described with reference to FIGS. 1A to 6.

Figure 1A:
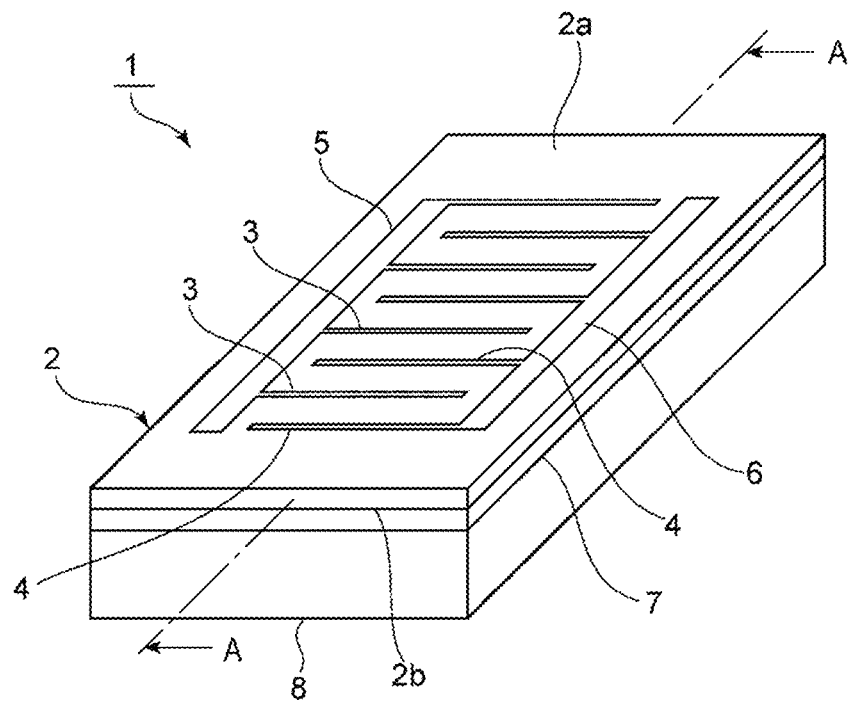
FIGS. 1A and 1B are respectively a simplified perspective view for explaining an acoustic wave resonator used in an acoustic wave device according to a first preferred embodiment of the present invention and a plan view illustrating an electrode structure on a piezoelectric layer.
Figure 1B:
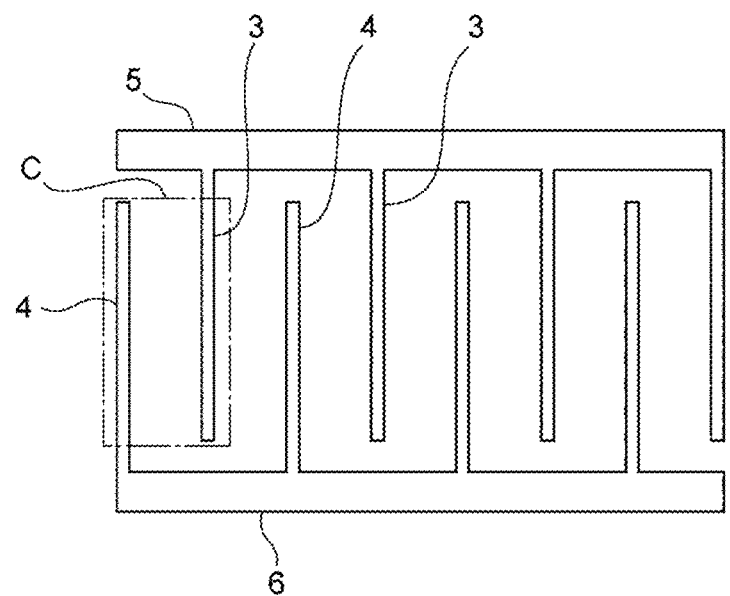
Figure 2:
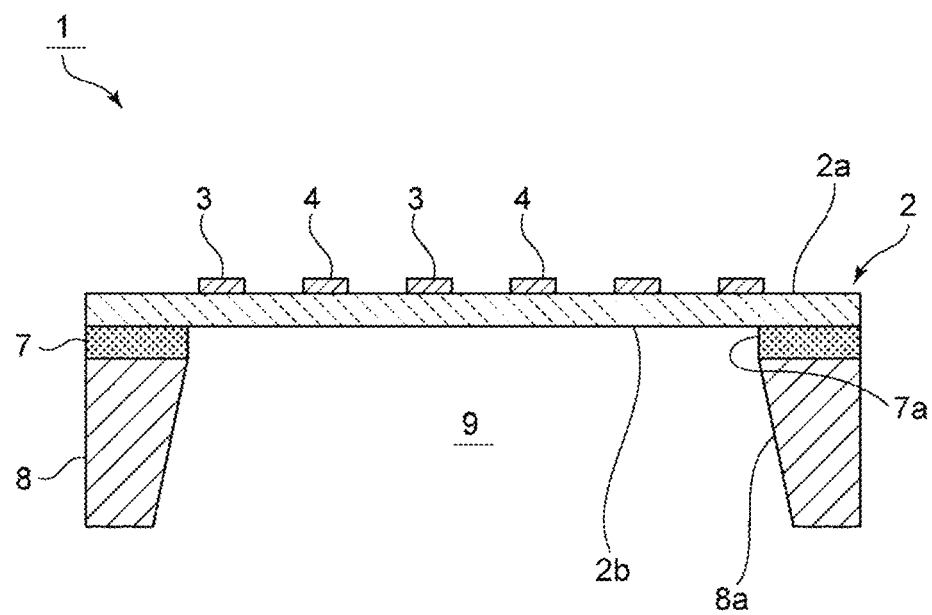
FIG. 2 is a sectional view of a portion taken along an A-A line of FIG. 1A.

FIG. 1A is a simplified perspective view for explaining an acoustic wave resonator included in an acoustic wave device according to a first preferred embodiment of the present invention, FIG. 1B is a plan view illustrating an electrode structure on a piezoelectric layer, and FIG. 2 is a sectional view of a portion taken along the A-A line of FIG. 1A. Here, FIG. 1A is the simplified perspective view illustrating an outer appearance of a portion on which one acoustic wave resonator of first and second acoustic wave resonators is provided.

An acoustic wave resonator 1 includes a piezoelectric layer 2 made of $LiNbO_3$. The piezoelectric layer 2 may be made of $LiTaO_3$. Cut-angles of $LiNbO_3$ and $LiTaO_3$ are Z-cut in the present preferred embodiment, but the cut-angles may be rotated Y-cut or X-cut. Although not especially limited, the thickness of the piezoelectric layer 2 may be preferably from about 50 nm to about 600 nm inclusive to obtain effective excitation in the thickness shear primary mode. The piezoelectric layer 2 includes a first main surface 2a and a second main surface 2b that are opposed to each other. An electrode 3 and an electrode 4 are provided, as at least one pair of electrodes, on the first main surface 2a.

In FIGS. 1A and 1B, a plurality of electrodes 3 are connected to a first busbar 5. A plurality of electrodes 4 are connected to a second busbar 6. The plurality of electrodes 3 and the plurality of electrodes 4 are interdigitated. The electrode and the electrode 4 have a rectangular shape and have a longitudinal direction. In a direction orthogonal to the longitudinal direction, the electrode 3 and adjacent electrode 4 are opposed to each other. Both of the longitudinal direction of the electrodes 3 and 4 and the direction orthogonal to the longitudinal direction of the electrodes 3 and 4 are directions intersecting with the thickness direction of the piezoelectric layer 2. Therefore, it can be said that the electrode 3 and adjacent electrode 4 are opposed to each other in the direction intersecting with the thickness direction of the piezoelectric layer 2. Further, the longitudinal direction of the electrodes 3 and 4 may be exchanged with the direction orthogonal to the longitudinal direction of the electrodes 3 and 4 illustrated in FIGS. 1A and 1B. Namely, the electrodes 3 and 4 may be extended in a direction in which the first busbar 5 and the second busbar 6 are extended in FIG. 1A and FIG. 1B. In this case, the first busbar 5 and the second busbar 6 are extended in the direction in which the electrodes 3 and 4 are extended in FIGS. 1A and 1B. A plurality of structures, namely, a plurality of pairs of mutually adjacent electrodes 3 and 4, where the electrode 3 is connected to one potential and the electrode 4 is connected to the other potential, are provided in the direction orthogonal to the longitudinal direction of the electrodes 3 and 4.

Here, the state in which the electrode 3 and the electrode 4 are adjacent to each other is not the state in which the electrode 3 and the electrode 4 are arranged to be in direct contact with each other but the state in which the electrode 3 and the electrode 4 are arranged with an interval therebetween. Further, when the electrode 3 and the electrode 4 are adjacent to each other, any other electrodes 3 and 4 or any electrodes connected to a hot potential and a ground potential are not arranged between these adjacent electrodes 3 and 4. The number of pairs does not have to be an integer but the pairs may be 1.5 pairs or 2.5 pairs, for example.

The distance between the centers of the electrodes 3 and 4, that is, the pitch is preferably in a range from about 1 μm to about 10 μm inclusive, for example. The distance between the centers of the electrodes 3 and 4 is the distance obtained by connecting the center of the electrode 3 in the width dimension in the direction orthogonal to the longitudinal direction of the electrode 3 and the center of the electrode 4 in the width dimension in the direction orthogonal to the longitudinal direction of the electrode 4. The width of the electrodes 3 and 4, namely, the dimension in the opposing direction of the electrodes 3 and 4 is preferably in a range from about 50 nm to about 1000 nm inclusive, for example.

The present preferred embodiment preferably includes the Z-cut piezoelectric layer and therefore, the direction orthogonal to the longitudinal direction of the electrodes 3 and 4 is a direction orthogonal to a polarization axis direction of the piezoelectric layer 2. This does not apply when piezoelectric layers of other cut-angles are used as the piezoelectric layer 2. Here, "orthogonal" is not limitedly used for the exactly orthogonal case but may be used for the substantially orthogonal case (within the range of about 90°±10°, for example, of an angle defined by the direction orthogonal to the longitudinal direction of the electrodes 3 and 4 and a polarization axis direction).

A support member 8 is laminated on the second main surface 2b side of the piezoelectric layer 2 with an insulation layer 7 interposed therebetween. The insulation layer 7 and the support member 8 have a frame shape and have cavities 7a and 8a respectively as illustrated in FIG. 2. Accordingly, an air gap 9 is formed. The air gap 9 is formed so as not to disturb vibration in an excitation region of the piezoelectric layer 2. Thus, the support member 8 is laminated on the second main surface 2b with the insulation layer 7 interposed therebetween, on a position which does not overlap with a portion provided with at least a pair of electrodes 3 and 4. Here, the insulation layer 7 does not necessarily have to be provided. Thus, the support member 8 can be directly or indirectly laminated on the second main surface 2b of the piezoelectric layer 2. The air gap 9 is not limited to including a through hole over the insulation layer 7 and the support member 8 but may include a through hole on the insulation layer 7 and a concave portion in the support member 8. In this case, the air gap 9 is between the piezoelectric layer 2 and the bottom portion of the support member 8 on the position overlapping with the portion provided with at least a pair of electrodes 3 and 4 in plan view.

The insulation layer 7 is made of silicon oxide. Also, an appropriate insulating material such as silicon oxynitride and alumina can be included as well as silicon oxide. The support member 8 is made of Si. A plane orientation of Si on a surface on the piezoelectric layer 2 side may be any one of (100), (110), and (111). Preferably, Si having high resistance of resistivity of about 4 kΩ, or greater is desirable. The support member 8 can also be made of an appropriate insulating material or semiconductor material.

The plurality of electrodes 3 and 4 and the first and second busbars 5 and 6 are made of appropriate metal or alloy such as Al and AlCu alloy. In the present preferred embodiment, the electrodes 3 and 4 and the first and second busbars 5 and 6 have the structure in which an Al film is laminated on a Ti film. Here, an adhesion layer other than the Ti film may be used.

An AC voltage is applied between the plurality of electrodes 3 and the plurality of electrodes 4 for driving. More specifically, an AC voltage is applied between the first busbar 5 and the second busbar 6. This can provide resonance characteristics using bulk waves in the thickness shear primary mode that are excited in the piezoelectric layer 2. When the thickness of the piezoelectric layer 2 is d and the distance between centers of any mutually adjacent electrodes 3 and 4 among the plurality of pairs of electrodes 3 and 4 is p, d/p is about 0.5 or lower in the acoustic wave resonator 1. Therefore, bulk waves in the thickness shear primary mode are effectively excited and favorable resonance characteristics can be obtained. d/p is more preferably about 0.24 or lower, and this case can provide more favorable resonance characteristics. In the case where the number of at least one of the electrodes 3 and 4 is plural as in the present preferred embodiment, that is, in the case where there are 1.5 or more pairs of electrodes 3 and 4 when the electrode 3 and the electrode 4 are defined as a pair of electrodes, the distance p between centers of mutually adjacent electrodes 3 and 4 is an average distance of distances between centers of respective mutually adjacent electrodes 3 and 4.

As the acoustic wave resonator 1 according to the present preferred embodiment has the above-described configuration, a Q value does not easily decrease even when the number of pairs of electrodes 3 and 4 is reduced to promote downsizing. This is because propagation loss is small even when the number of electrode fingers in reflectors on both sides is reduced. Further, the number of electrode fingers can be reduced because of the use of bulk waves in the thickness shear primary mode. The difference between Lamb waves used in an acoustic wave device of related art and bulk waves in the thickness shear primary mode described above will be described with reference to FIGS. 3A and 3B.

Figure 3A:
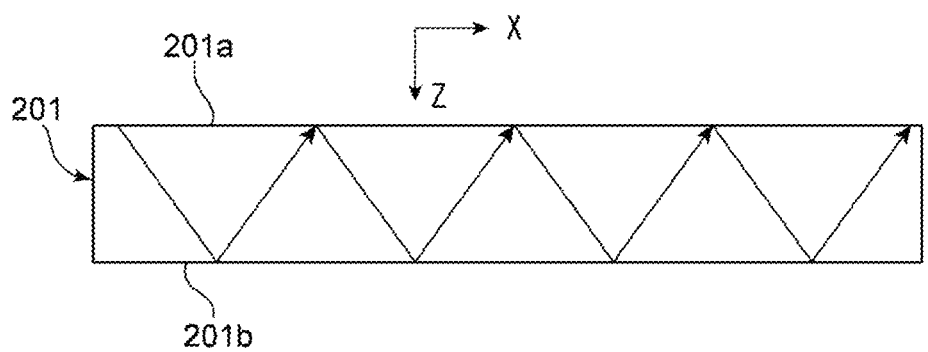
FIG. 3A is a schematic elevational cross-sectional view for explaining Lamb waves that propagate through a piezoelectric film of an acoustic wave device of related art.

FIG. 3A is a schematic elevational cross-sectional view for explaining Lamb waves that propagate through a piezoelectric film of an acoustic wave device as the one described in Japanese Unexamined Patent Application Publication No. 2012-257019. In this case, the wave propagates in a piezoelectric film 201 as illustrated with arrows. Here, a first main surface 201a and a second main surface 201b are opposed to each other in the piezoelectric film 201, and a thickness direction connecting the first main surface 201a and the second main surface 201b is the Z direction. The X direction is a direction in which electrode fingers of an IDT electrode are aligned. As illustrated in FIG. 3A, in the case of a Lamb wave, the wave propagates in the X direction as illustrated in the drawing. Even though the entire piezoelectric film 201 vibrates, the wave propagates in the X direction because the wave is a plate wave. Therefore, reflectors are arranged on the both sides so as to obtain resonance characteristics. Consequently, wave propagation loss is generated, and when downsizing is promoted, namely, when the number of pairs of electrode fingers is reduced, a Q value is lowered.

Figure 3B:
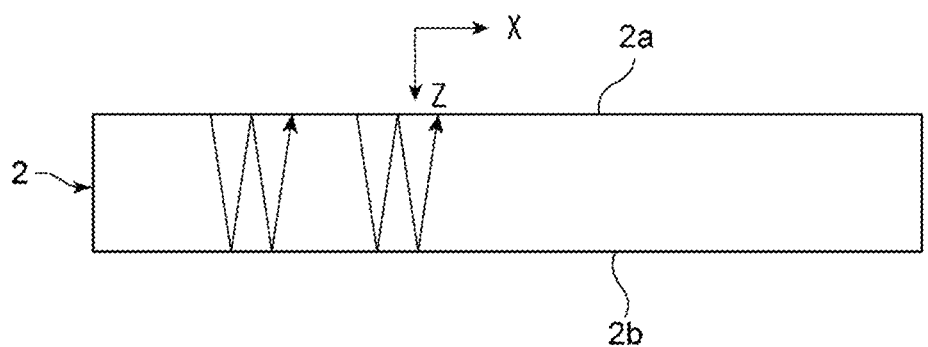
FIG. 3B is a schematic elevational cross-sectional view for explaining bulk waves in a thickness shear primary mode that propagate through a piezoelectric layer in an acoustic wave device according to a preferred embodiment of the present invention.

On the other hand, vibration displacement is in a thickness shear direction in the acoustic wave device according to the present preferred embodiment. Therefore, a wave mostly propagates and resonates in the direction connecting the first main surface 2a and the second main surface 2b of the piezoelectric layer 2, namely, in the Z direction as illustrated in FIG. 3B. That is, X-direction components of the wave are remarkably smaller than Z-direction components. Resonance characteristics can be obtained by this wave propagation in the Z direction and therefore, propagation loss is not generated even when the number of reflectors is reduced. Further, even when the number of pairs of electrodes including the electrodes 3 and 4 is reduced to promote downsizing, a Q value does not easily decrease.

Figure 4:
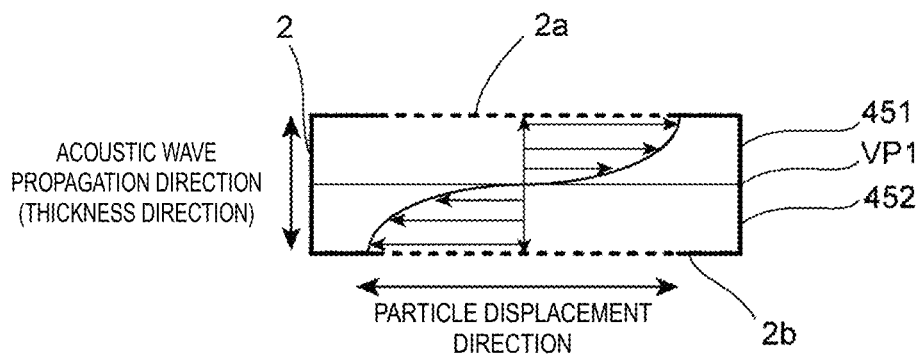
FIG. 4 is a diagram illustrating an amplitude direction of bulk waves in the thickness shear primary mode.

The amplitude direction of bulk waves in the thickness shear primary mode is reversed between a first region 451 included in an excitation region of the piezoelectric layer 2 and a second region 452 included in the excitation region, as illustrated in FIG. 4. FIG. 4 schematically illustrates a bulk wave in a case applying a voltage, by which the electrode 4 has a higher potential than the electrode 3, between the electrode 3 and the electrode 4 of FIG. 2. The first region 451 is a region between a virtual plane VP1, which is orthogonal to the thickness direction of the piezoelectric layer 2 and divides the piezoelectric layer 2 into two, and the first main surface 2a, in the excitation region. The second region 452 is a region between the virtual plane VP1 and the second main surface 2b, in the excitation region.

The acoustic wave resonator 1 includes at least one pair of electrodes including the electrode 3 and the electrode 4, as described above. However, waves do not propagate in the X direction in the acoustic wave resonator 1 and therefore, the number of pairs of electrodes including the electrodes 3 and 4 does not have to be plural. That is, it is enough to provide at least one pair of electrodes.

For example, the electrode 3 described above is an electrode connected to a hot potential and the electrode 4 is an electrode connected to a ground potential. However, the electrode 3 may be connected to a ground potential and the electrode 4 may be connected to a hot potential. In the present preferred embodiment, at least one pair of electrodes is an electrode connected to a hot potential or an electrode connected to a ground potential as mentioned above, and no floating electrodes are provided.

Figure 5:
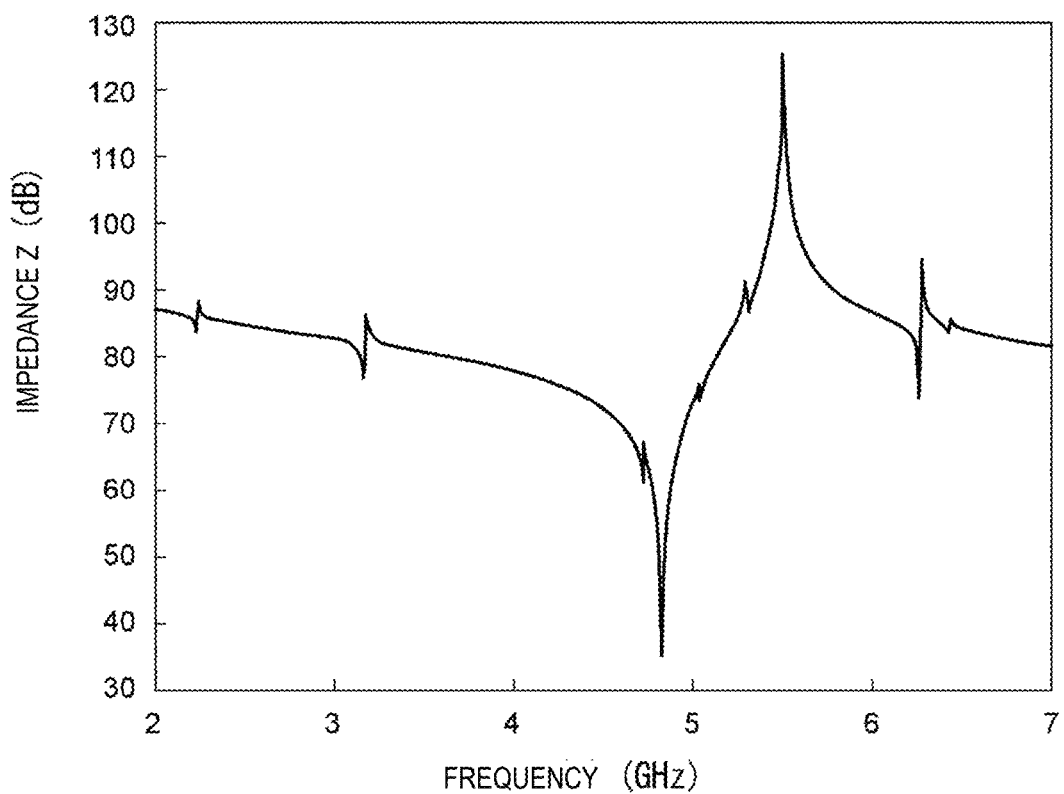
FIG. 5 is a diagram illustrating resonance characteristics of one acoustic wave resonator in the acoustic wave device according to a preferred embodiment of the present invention.

FIG. 5 is a diagram illustrating an example of resonance characteristics of the acoustic wave resonator 1 according to a preferred embodiment of the present invention. The following are the design parameters of the acoustic wave resonator 1 having the resonance characteristics.

Piezoelectric layer 2: $LiNbO_3$ of Euler angles (0°, 0°, 90°), thickness=400 nm.

The length of a region in which the electrode 3 and the electrode 4 overlap with each other when viewed in the direction orthogonal to the longitudinal direction of the electrode 3 and the electrode 4, namely, the length of the excitation region=40 μm, the number of pairs of electrodes including the electrodes 3 and 4=21 pairs, the distance between centers of electrodes=3 μm, the width of the electrodes 3 and 4=500 nm, d/p=0.133, for example.

Insulation layer 7: a silicon oxide film having the thickness of 1 μm.

Support member 8: Si.

The length of the excitation region is a dimension of the excitation region along the longitudinal direction of the electrodes 3 and 4.

The present preferred embodiment includes the configuration in which the electrode distances among a plurality of pairs of electrodes including the electrodes 3 and 4 are all equal to each other. That is, the electrodes 3 and the electrodes 4 are arranged at equal pitches.

Apparent from FIG. 5, favorable resonance characteristics in which a specific band is about 12.5% can be obtained even without providing reflectors.

Here, when the thickness of the piezoelectric layer 2 is d and the distance between electrode centers of the electrodes 3 and 4 is p, d/p is about 0.5 or lower, more preferably about 0.24 or lower as described above, in the present preferred embodiment. This will be described with reference to FIG. 6.

Figure 6:
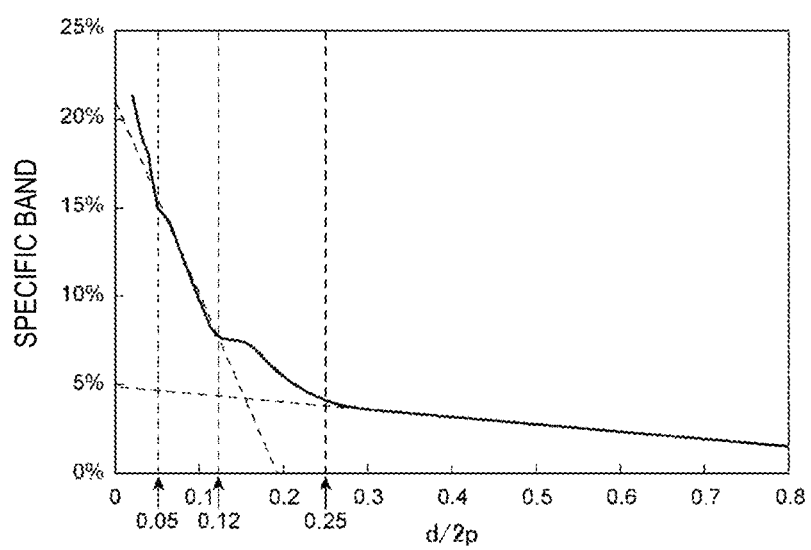
FIG. 6 is a diagram illustrating a relation between d/2p and a specific band as a resonator when a distance between centers of mutually adjacent electrodes is p and a thickness of a piezoelectric layer is d.

A plurality of acoustic wave resonators that are similar to the acoustic wave resonator having the resonance characteristics illustrated in FIG. 5 are obtained while changing d/2p. FIG. 6 is a diagram illustrating a relation between the d/2p and a specific band as a resonator of the acoustic wave device.

Apparent from FIG. 6, when d/2p exceeds about 0.25, that is, when d/p>about 0.5, the specific band is less than about 5% even when d/p is adjusted. In contrast to this, when d/2p about 0.25, that is, when d/p≤about 0.5, the specific band can be set to about 5% or greater by changing d/p within the range, namely, a resonator having a high coupling coefficient can be configured. Further, when d/2p is about 0.12 or lower, that is, when d/p is about 0.24 or lower, the specific band can be increased to about 7% or greater. In addition to this, if d/p is adjusted within this range, a resonator having a wider specific band can be obtained, being able to realize a resonator having a higher coupling coefficient. Thus, it is shown that a resonator which uses bulk waves in the thickness shear primary mode and has a high coupling coefficient can be configured by setting d/p to about 0.5 or lower as the second preferred embodiment of the present invention.

The above-mentioned p is the distance between centers of mutually adjacent electrodes 3 and 4 as described above.

Figure 7A:
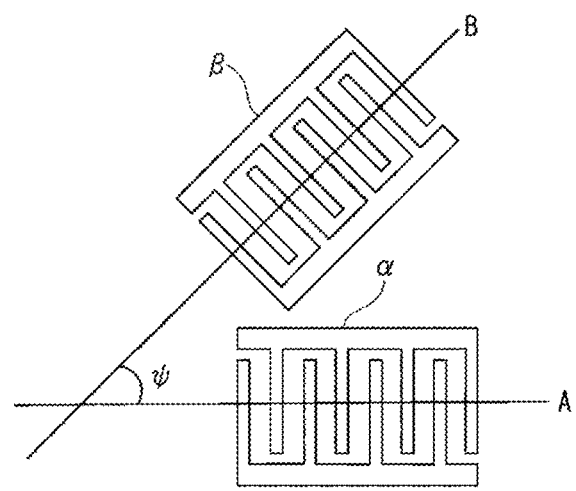
FIGS. 7A and 7B are schematic plan views for explaining an angle defined by a direction orthogonal to a longitudinal direction of a first electrode and a direction orthogonal to a longitudinal direction of a second electrode.
Figure 7B:
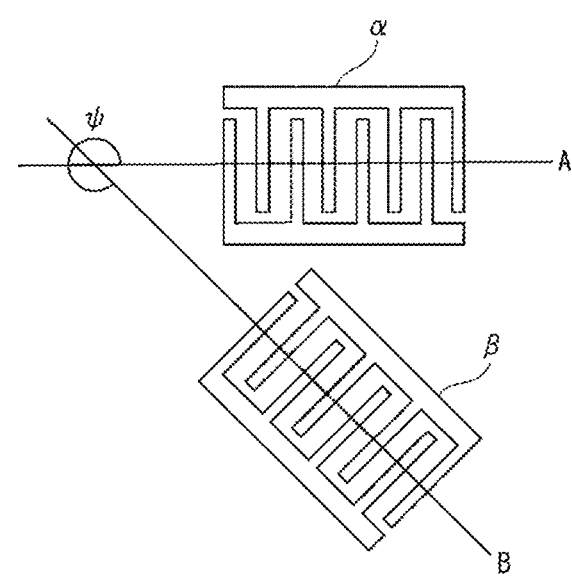

In a preferred embodiment of the present invention, a plurality of pairs of electrodes include at least one pair of first electrodes of a first acoustic wave resonator and at least one pair of second electrodes of a second acoustic wave resonator, and the direction orthogonal to the longitudinal direction of the second electrode in the second acoustic wave resonator is inclined at an angle which is greater than 0° and smaller than 360° with respect to the direction orthogonal to the longitudinal direction of the first electrode in the first acoustic wave resonator. Accordingly, spurious can be reduced and degradation in filter characteristics can be reduced or prevented when a filter is configured. This will be more specifically described with reference to FIGS. 7A and 7B to FIG. 11. Here, when the angle defined by the direction orthogonal to the longitudinal direction of the second electrode with respect to the direction orthogonal to the longitudinal direction of the first electrode is 0°, coupling directions from input ends to output ends of the two are mutually-identical directions. As illustrated in FIGS. 7A and 7B, an angle defined by a direction orthogonal to a longitudinal direction of a second electrode β (a straight line B in FIGS. 7A and 7B) with respect to a direction orthogonal to a longitudinal direction of a first electrode α (a straight line A in FIGS. 7A and 7B) has a value where a direction rotating counterclockwise about the first acoustic wave resonator is a positive direction of the angle. When the coupling direction from the input end to the output end of the first electrode in the first acoustic wave resonator is opposite to the coupling direction from the input end to the output end of the second electrode in the second acoustic wave resonator, the angle mentioned above is about 180°, for example.

Figure 8:
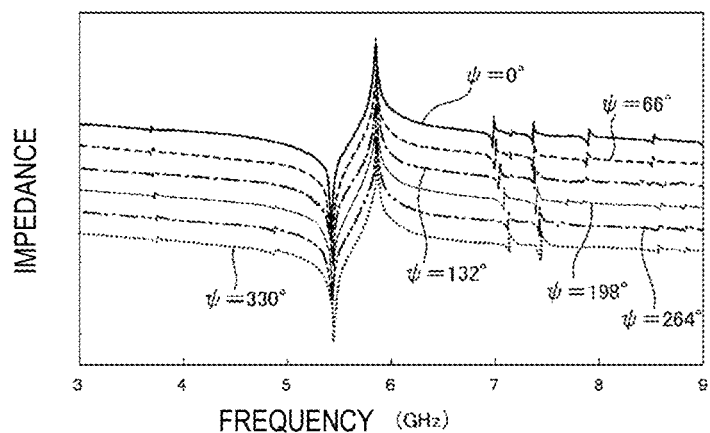
FIG. 8 is a diagram illustrating resonance characteristics of acoustic wave resonators that are obtained by incrementing ψ by 66° in Euler angles (0°, 0°, ψ) in the acoustic wave resonators in which an IDT electrode made of Al is provided on a piezoelectric layer made of lithium niobate.

FIG. 8 is a diagram illustrating resonance characteristics of the acoustic wave device according to a preferred embodiment of the present invention that includes a piezoelectric layer made of lithium niobate of Euler angles (0°, 0°, ψ). In this example, a multitude of acoustic wave resonators were configured by incrementing a propagation orientation ψ of a surface acoustic wave in lithium niobate by about 66° in a range from 0° or greater to smaller than 360°, and resonance characteristics of these acoustic wave resonators were obtained. The thickness of the piezoelectric layer was about 400 nm, the IDT electrode was including an Al film having the thickness of about 100 nm, and the electrode finger pitch of the IDT electrode was about 0.25 μm.

FIG. 8 clearly shows that a frequency position of spurious varies as the propagation orientation ψ varies. On the other hand, it is shown that resonance characteristics in the main mode are stably developed. This is because spurious is a surface acoustic wave and is accordingly influenced by the propagation orientation ψ, while the main mode uses a bulk wave in the thickness shear primary mode and accordingly the bulk wave is hardly influenced by the propagation orientation ψ.

In a preferred embodiment of the present invention, spurious is reduced, without degrading resonance characteristics in the main mode, by varying a propagation orientation ψ of a plurality of acoustic wave resonators based on the fact that a frequency position of spurious varies as the propagation orientation ψ varies when configuring the acoustic wave resonator (that uses bulk waves in the thickness shear primary mode or in which d/p is about 0.5 or lower when the thickness of the piezoelectric layer is d and the distance between centers of mutually adjacent electrodes is p) according to the present preferred embodiment of the present invention. This will be more specifically described with reference to FIGS. 9 and 10.

Figure 9:
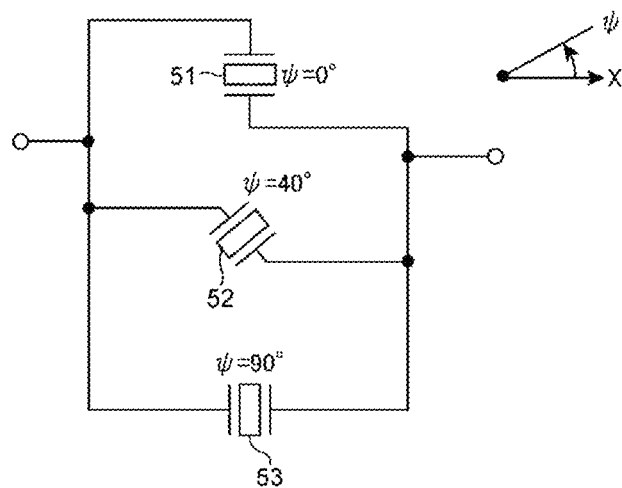
FIG. 9 is a simplified circuit diagram of the acoustic wave device according to the first preferred embodiment of the present invention.

FIG. 9 is a simplified circuit diagram of Example 1 of the acoustic wave device according to the first preferred embodiment of the present invention. In Example 1, a plurality of acoustic wave resonators 51 to 53 are connected in parallel. The acoustic wave resonators 51 to 53 are configured in a similar manner to the acoustic wave resonator 1. Euler angles of lithium niobate were (0°, 0°, ψ), and it was defined that ψ=0° in the acoustic wave resonator 51, ψ=40° in the acoustic wave resonator 52, and ψ=90° in the acoustic wave resonator 53. Other configurations were the same as those of the acoustic wave resonators having the resonance characteristics illustrated in FIG. 8.

Figure 10:
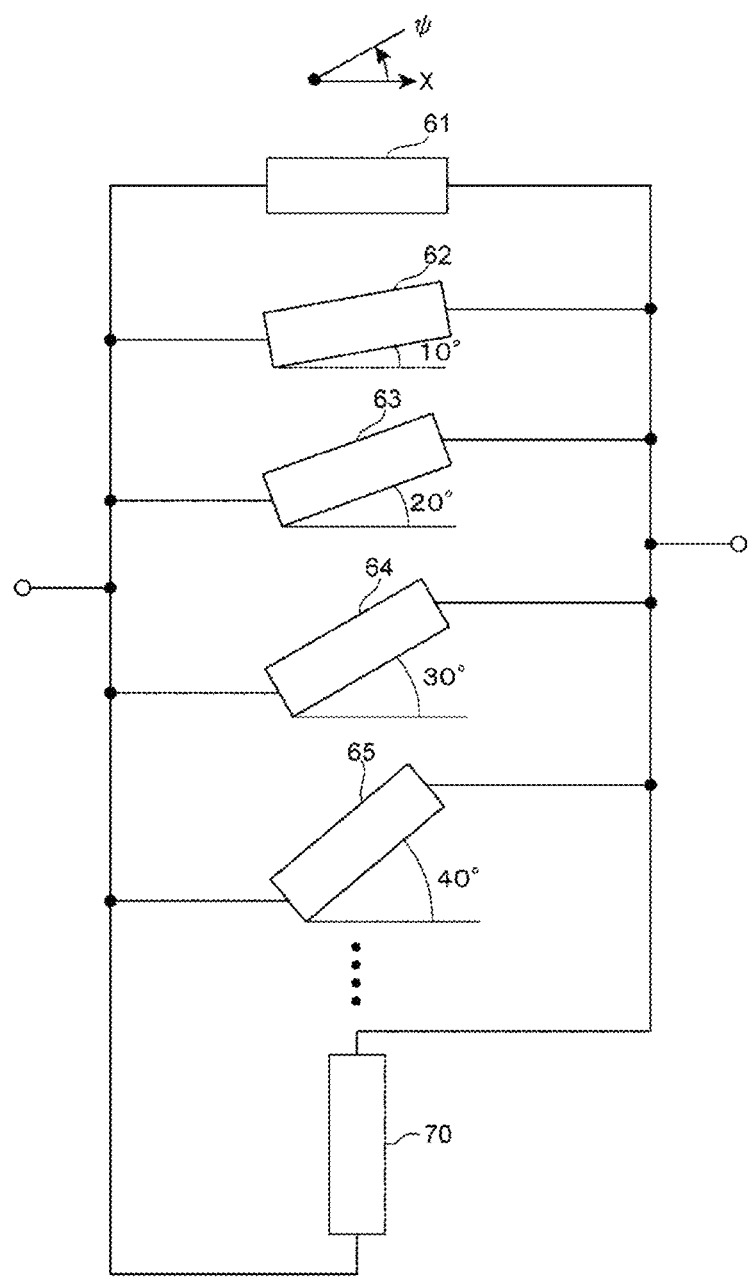
FIG. 10 is a simplified circuit diagram of an acoustic wave device according to a second preferred embodiment of the present invention.

FIG. 10 is a simplified circuit diagram of Example 2 of an acoustic wave device according to a second preferred embodiment of the present invention. In Example 2, 10 portions of acoustic wave resonators 61, 62, 63, 64, 65, . . . , and 70 are connected in parallel. Also, ψ in Euler angles (0°, 0°, Iv) was defined as 0° in the acoustic wave resonator 61, and ψ was incremented by 10° to obtain ψ=90° in the acoustic wave resonator 70 in Example 2.

Each of the acoustic wave resonators in Example 2 was also similar to the acoustic wave resonators having the resonance characteristics illustrated in FIG. 8 other than a propagation orientation.

Figure 11:
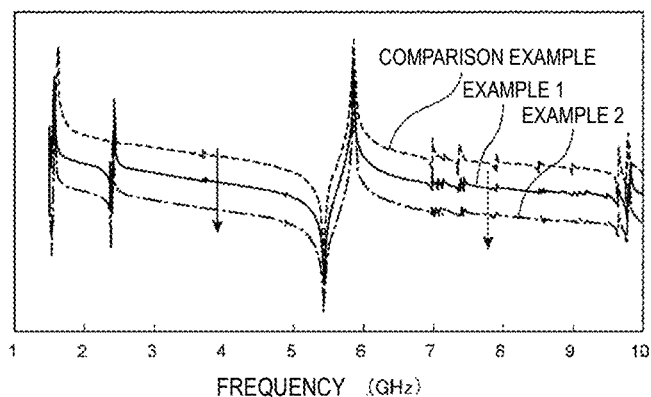
FIG. 11 is a diagram illustrating resonance characteristics of the acoustic wave devices in Examples 1 and 2 and resonance characteristics of an acoustic wave resonator in a comparison example.

A solid line in FIG. 11 represents resonance characteristics of the acoustic wave device in Example 1, and a dashed-dotted line represents resonance characteristics of the acoustic wave device in Example 2. For comparison, a dashed line represents resonance characteristics of a single acoustic wave resonator having propagation orientation of ψ=0°, as a comparison example.

FIG. 11 clearly shows that the magnitude of spurious can be reduced in Example 1 compared to the resonance characteristics of the acoustic wave resonator of the comparison example represented by the dashed line. It is shown that the magnitude of spurious can be reduced in Example 2 more than in Example 1. It is considered that this is because frequency positions on which spurious appears are dispersed as a plurality of acoustic wave resonators, whose propagation orientations are different from each other, are connected in parallel in Example 1 and Example 2. The resonance characteristics in the main mode are stably developed in both of Example 1 and Example 2. This is because other acoustic waves such as surface acoustic waves and plate waves are not used but the thickness shear primary mode is used (or because d/p is about 0.5 or lower when the thickness of a piezoelectric layer is d and the distance between centers of mutually adjacent electrodes is p).

According to Example 1 and Example 2, spurious can be reduced and accordingly, degradation in filter characteristics can be reduced or prevented when a band pass filter is configured with the acoustic wave device of Example 1 or Example 2.

Figure 12:
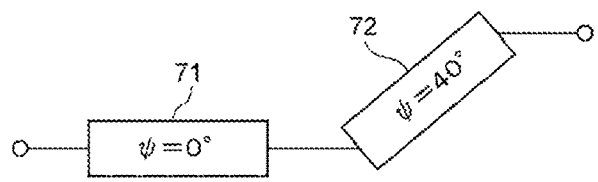
FIG. 12 is a simplified circuit diagram of an acoustic wave device according to a third preferred embodiment of the present invention.

FIG. 12 is a simplified circuit diagram of an acoustic wave device according to a third preferred embodiment of the present invention. In the third preferred embodiment, a first acoustic wave resonator 71 and a second acoustic wave resonator 72 are connected in series. The first and second acoustic wave resonators may be thus connected in series in a preferred embodiment of the present invention. In this preferred embodiment, the propagation orientation ψ is 0° in the first acoustic wave resonator 71 and the propagation orientation ψ is 40° in the second acoustic wave resonator 72. Also in this configuration, spurious can be reduced by setting mutually-different propagation orientations between these two.

Figure 13:
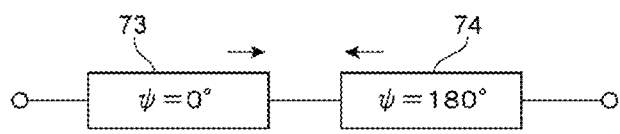
FIG. 13 is a simplified circuit diagram of an acoustic wave device according to a fourth preferred embodiment of the present invention.

FIG. 13 is a simplified circuit diagram of an acoustic wave device according to a fourth preferred embodiment of the present invention. In this preferred embodiment, a first acoustic wave resonator 73 and a second acoustic wave resonator 74 are connected in series. The propagation orientation ψ of a piezoelectric layer is 0° in the first acoustic wave resonator 73 and the propagation orientation ψ=180° holds in the second acoustic wave resonator 74. Thus, the direction orthogonal to the longitudinal direction of the first electrode and the direction orthogonal to the longitudinal direction of the second electrode may be about 180° in a preferred embodiment of the present invention.

Figure 14:
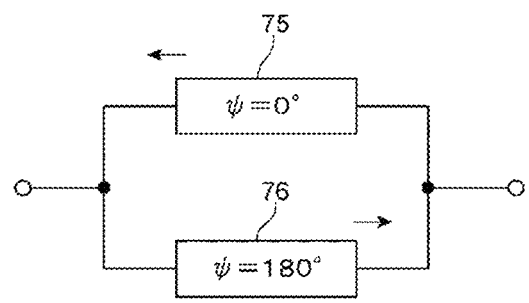
FIG. 14 is a simplified circuit diagram of an acoustic wave device according to a fifth preferred embodiment of the present invention.

FIG. 14 is a simplified circuit diagram of an acoustic wave device according to a fifth preferred embodiment of the present invention. A first acoustic wave resonator 75 and a second acoustic wave resonator 76 are connected in parallel. The propagation orientation ψ of lithium niobate is 0° in the first acoustic wave resonator 75 and the propagation orientation ψ=180° holds in the second acoustic wave resonator 76. Therefore, as shown with arrows, a direction coupling an input end to an output end of the first acoustic wave resonator 75 and a direction coupling an input end to an output end of the second acoustic wave resonator 76 are opposite to each other. Thus, the direction orthogonal to the longitudinal direction of the second electrode in the second acoustic wave resonator 76 with respect to the direction orthogonal to the longitudinal direction of the first electrode in the first acoustic wave resonator 75 may be 180° also in the configuration in which the first and second acoustic wave resonators 75 and 76 are connected in parallel.

Unless an angle defined by these two is 0° or 360°, spurious in the acoustic wave resonators can be reduced.

Figure 15:
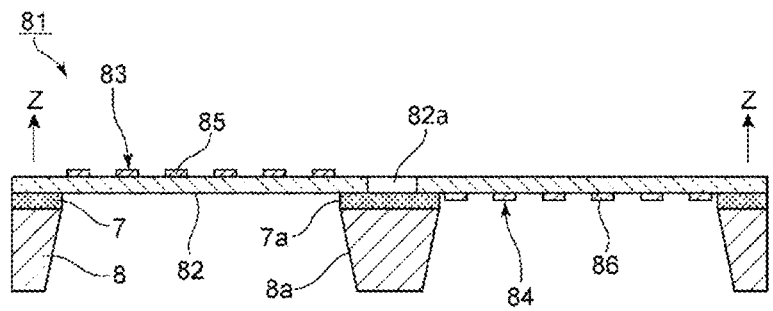
FIG. 15 is an elevational cross-sectional view for explaining an acoustic wave device according to a sixth preferred embodiment of the present invention.

FIG. 15 is an elevational cross-sectional view for explaining an acoustic wave device according to a sixth preferred embodiment of the present invention.

An acoustic wave device 81 uses a piezoelectric layer 82 made of lithium niobate or lithium tantalate. A first acoustic wave resonator 83 and a second acoustic wave resonator 84 are configured in an integrated manner by using the single piezoelectric layer 82. A slit 82a is formed on the piezoelectric layer 82. On one side of the slit 82a, at least one pair of first electrodes 85 is formed on an upper surface serving as a first main surface of the piezoelectric layer 82. On the other side of the slit 82a, at least one pair of second electrodes 86 is formed on a lower surface serving as a second main surface of the piezoelectric layer 82.

Further, the support member 8 is fixed on the lower surface of the piezoelectric layer 82 with the insulation layer 7 interposed therebetween. The cavity 7a and the cavity 8a are respectively formed on the insulation layer 7 and the support member 8. That is, an air gap is formed by the cavity 7a and the cavity 8a as is the case with the acoustic wave resonator 1. Accordingly, the air gap is below a region in which the first electrodes 85 of the first acoustic wave resonator 83 are provided. In a similar manner, the air gap is below a region in which the second electrodes 86 are provided in the second acoustic wave resonator 84. Here, a polarization axis of the piezoelectric layer 82 is in a direction shown with an arrow Z. Thus, a polarization axis direction of the first acoustic wave resonator 83 and a polarization axis direction of the second acoustic wave resonator are identical to each other, but an angle defined by the direction orthogonal to the extending direction of the first electrode in the first acoustic wave resonator 83 and the direction orthogonal to the extending direction of the second electrode 86 in the second acoustic wave resonator 84 is about 180°. In the use of the piezoelectric layer 82 having a uniform polarization axis direction, a forming surface of the first electrodes 85 and a forming surface of the second electrodes 86 may be opposite to each other. This case can also provide similar advantageous effects when the angle defined by the direction orthogonal to the extending direction of the first electrode 85 and the direction orthogonal to the extending direction of the second electrode 86 is greater than 0° and smaller than 360°.

An acoustic wave device according to a preferred embodiment of the present invention includes the first acoustic wave resonator and the second acoustic wave resonator and is favorably used for configuring a band pass filter, and spurious is reduced, and degradation in filter characteristics is reduced or prevented. A circuit configuration of such a band pass filter is not especially limited as long as a plurality of acoustic wave resonators are used.

Figure 16:
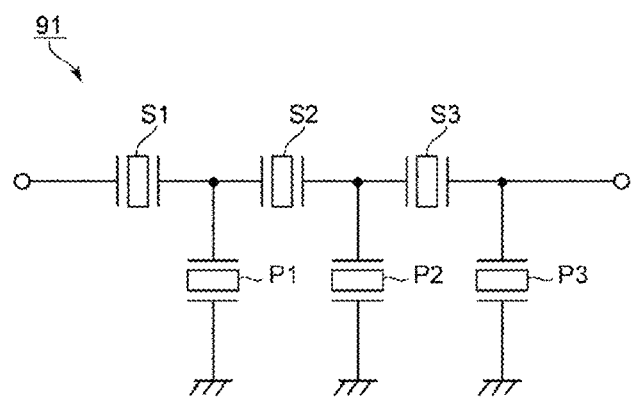
FIG. 16 is a circuit diagram of a ladder filter as a filter including an acoustic wave device according to a preferred embodiment of the present invention.

FIG. 16 is a circuit diagram of a ladder filter as a filter including an acoustic wave device according to a preferred embodiment of the present invention.

A ladder filter 91 includes a plurality of series arm resonators S1 to S3 and a plurality of parallel arm resonators P1 to P3. When any one of the series arm resonators S1 to S3 and parallel arm resonators P1 to P3 is including the first acoustic wave resonator and at least one of other acoustic wave resonators is including the second acoustic wave resonator, a ladder filter exhibiting little degradation in filter characteristics can be obtained. For example, any one series arm resonator may be the first acoustic wave resonator and any one parallel arm resonator may be the second acoustic wave resonator.

The number of series arm resonators and the number of parallel arm resonators in the ladder filter are not especially limited.

Figure 17:
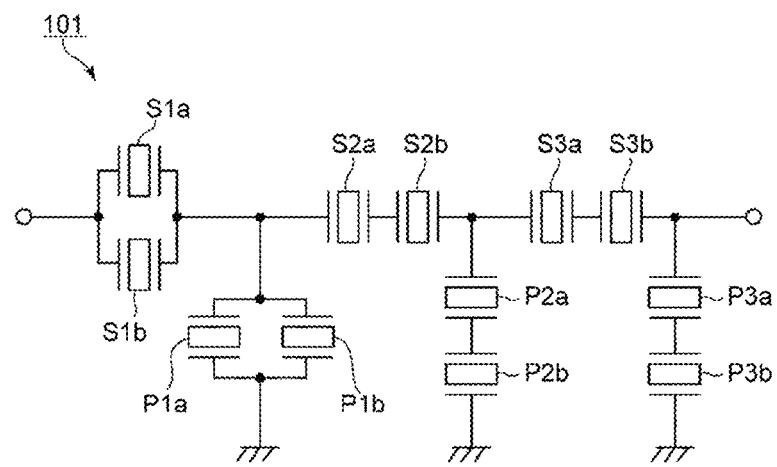
FIG. 17 is a circuit diagram illustrating another example of a ladder filter to which a preferred embodiment of the present invention is applied.

FIG. 17 is a circuit diagram illustrating another example of a ladder filter to which a preferred embodiment of the present invention is applied.

In a ladder filter 101 illustrated in FIG. 17, a series arm resonator and a parallel arm resonator are including divided type acoustic wave resonators that are obtained by dividing one acoustic wave resonator. A series arm resonator S1a and a series arm resonator Sib are connected in parallel. That is, the series arm resonator S1 illustrated in FIG. 16 is replaced with an acoustic wave resonator of parallel connection divided type that is including the series arm resonator S1a and the series arm resonator Sib. In this case, the series arm resonator S1a may be including the first acoustic wave resonator of the acoustic wave device according to a preferred embodiment of the present invention and the series arm resonator Sib may be including the second acoustic wave resonator. In this configuration, spurious can be effectively reduced in the resonance characteristics of the acoustic wave resonators in the parallel connection structure.

In the ladder filter 101, the series arm resonator S2 illustrated in FIG. 16 is including series arm resonators S2a and S2b of divided type that are connected with each other in series, and the series arm resonator S3 illustrated in FIG. 16 is including series arm resonators S3a and S3b of divided type that are connected with each other in series. In this case as well, when the two series arm resonators S2a and S2b or series arm resonators S3a and S3b are the first and second acoustic wave resonators, spurious can be effectively reduced. Similarly, in terms of a parallel arm resonator, a parallel arm resonator Pia and a parallel arm resonator P1b are connected in parallel. A parallel arm resonator P2a and a parallel arm resonator P2b are connected in series and a parallel arm resonator P3a and a parallel arm resonator P3b are connected in series. In the case of the parallel arms as well, spurious appearing in resonance characteristics can be effectively reduced by connecting a plurality of parallel arm resonators, having mutually-different propagation orientations w, in parallel or in series.

In a preferred embodiment of the present invention, the first acoustic wave resonator and the second acoustic wave resonator may be used as a plurality of acoustic wave resonators for providing a pass band, and the first acoustic wave resonator and the second acoustic wave resonator may be used as divided type acoustic wave resonators obtained by dividing one acoustic wave resonator into a plurality of acoustic wave resonators, as described above.

Figure 18:
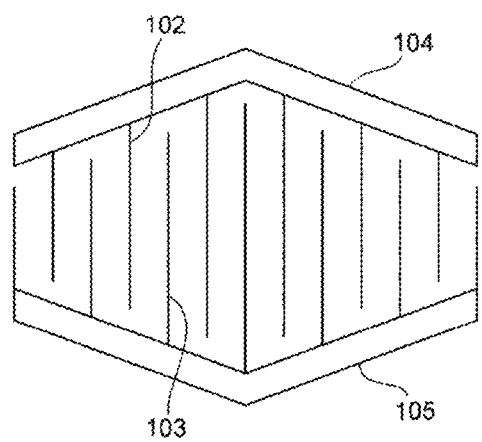
FIG. 18 is a plan view illustrating an example of a first or second electrode in an acoustic wave device according to a preferred embodiment of the present invention.

Further, at least one pair of electrodes of the first or second acoustic wave resonator is not limited to a regular IDT electrode, but first and second busbars 104 and 105 may be non-parallel to each other as, for example, an IDT electrode illustrated in FIG. 18, in the present invention. In this configuration, electrode fingers 102 and 103 are respectively connected to the first and second busbars 104 and 105.

Figure 19:
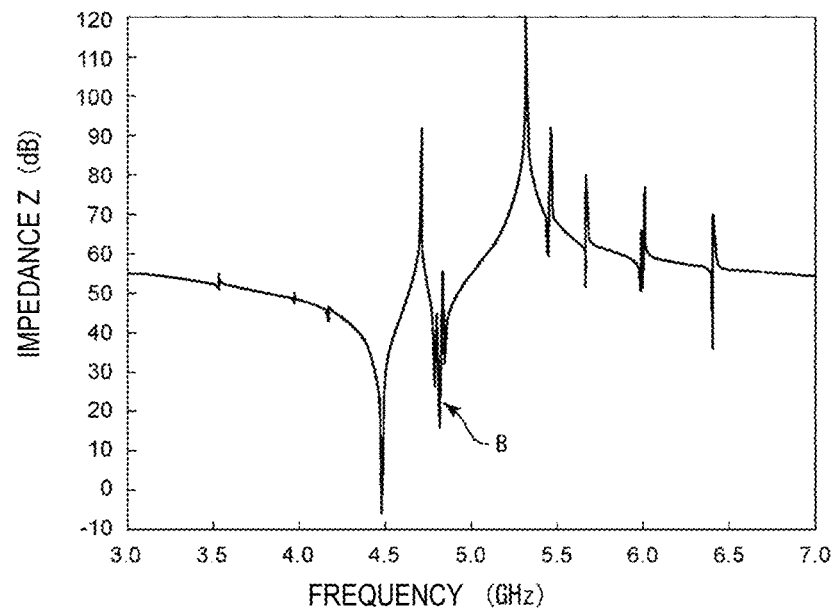
FIG. 19 is a reference diagram illustrating an example of resonance characteristics of an acoustic wave device according to a preferred embodiment of the present invention.

Furthermore, any mutually adjacent electrodes 3 and 4 among the plurality of electrodes 3 and 4 preferably have a metallization ratio MR that satisfies MR≤1.75(d/p)+0.075, with respect to an excitation region, which is a region in which the mutually adjacent electrodes 3 and 4 overlap with each other when viewed in the opposing direction thereof. This case can effectively reduce spurious. This will be described with reference to FIG. 19 and FIG. 20. FIG. 19 is a reference diagram illustrating an example of resonance characteristics of the acoustic wave device 1 according to a preferred embodiment of the present invention. Spurious shown with an arrow B is present between a resonant frequency and an anti-resonant frequency. Here, it is defined that d/p=0.08 and Euler angles of LiNbO$_3$ is (0°, 0°, 90°). Further, the metallization ratio MR mentioned above is defined as MR=0.35.

The metallization ratio MR will be described with reference to FIG. 1B. Focusing on one pair of electrodes 3 and 4 in the electrode structure of FIG. 1B, it is assumed that only this pair of electrodes 3 and 4 is provided. In this case, a portion enclosed by a dashed-dotted line C is an excitation region. This excitation region is a region of the electrode 3 in which the electrode 3 overlaps with the electrode 4, a region of the electrode 4 in which the electrode 4 overlaps with the electrode 3, and a region in which the electrode 3 and the electrode 4 overlap with each other in a region between the electrode 3 and the electrode 4, when the electrode 3 and the electrode 4 are viewed in the direction orthogonal to the longitudinal direction of the electrodes 3 and 4, that is, in the opposing direction thereof. An area of the electrodes 3 and 4 in the excitation region C with respect to an area of the excitation region is the metallization ratio MR. Namely, the metallization ratio MR is a ratio of an area of a metallization portion with respect to an area of an excitation region.

When a plurality of pairs of electrodes are provided, MR may be set to a rate of metallization portions included in all excitation regions with respect to a total of areas of the excitation regions.

Figure 20:
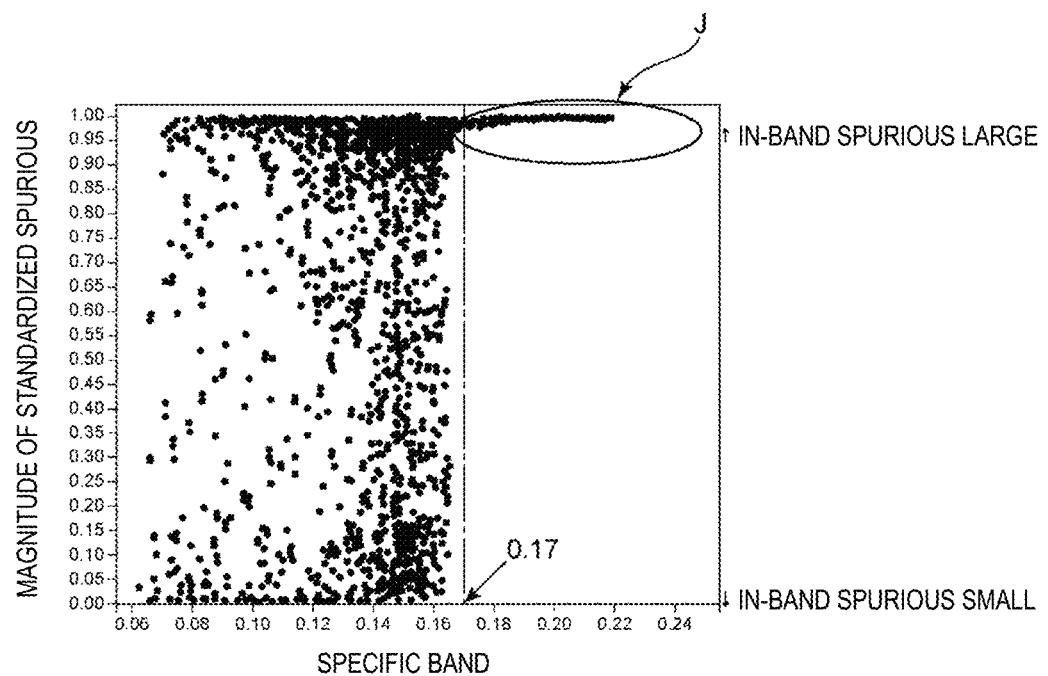
FIG. 20 is a diagram illustrating a relation between a specific band and a magnitude of standardized spurious.

FIG. 20 is a diagram illustrating a relation between specific bands obtained in configuring a multitude of acoustic wave resonators and phase rotation amounts of impedance of spurious which is standardized at 180 degrees as the magnitudes of spurious, in accordance with the present preferred embodiment. Here, in terms of the specific bands, the film thickness of piezoelectric layers and the dimension of electrodes, for example, were variously changed and adjusted. FIG. 20 illustrates a result obtained when piezoelectric layers made of Z-cut LiNbO$_3$ were used, but a similar tendency is obtained when piezoelectric layers of other cut-angles are used.

A region enclosed with an ellipse J in FIG. 20 has large spurious which is about 1.0. Apparent from FIG. 20, when the specific band exceeds about 0.17, that is, exceeds about 17%, large spurious whose spurious level is 1 or greater appears in a pass band even when parameters for defining the specific band are changed. Consequently, the specific band is preferably about 17% or less. In this case, spurious can be reduced by adjusting the film thickness of the piezoelectric layer 2 and the dimensions of the electrodes 3 and 4, for example.

Figure 21:
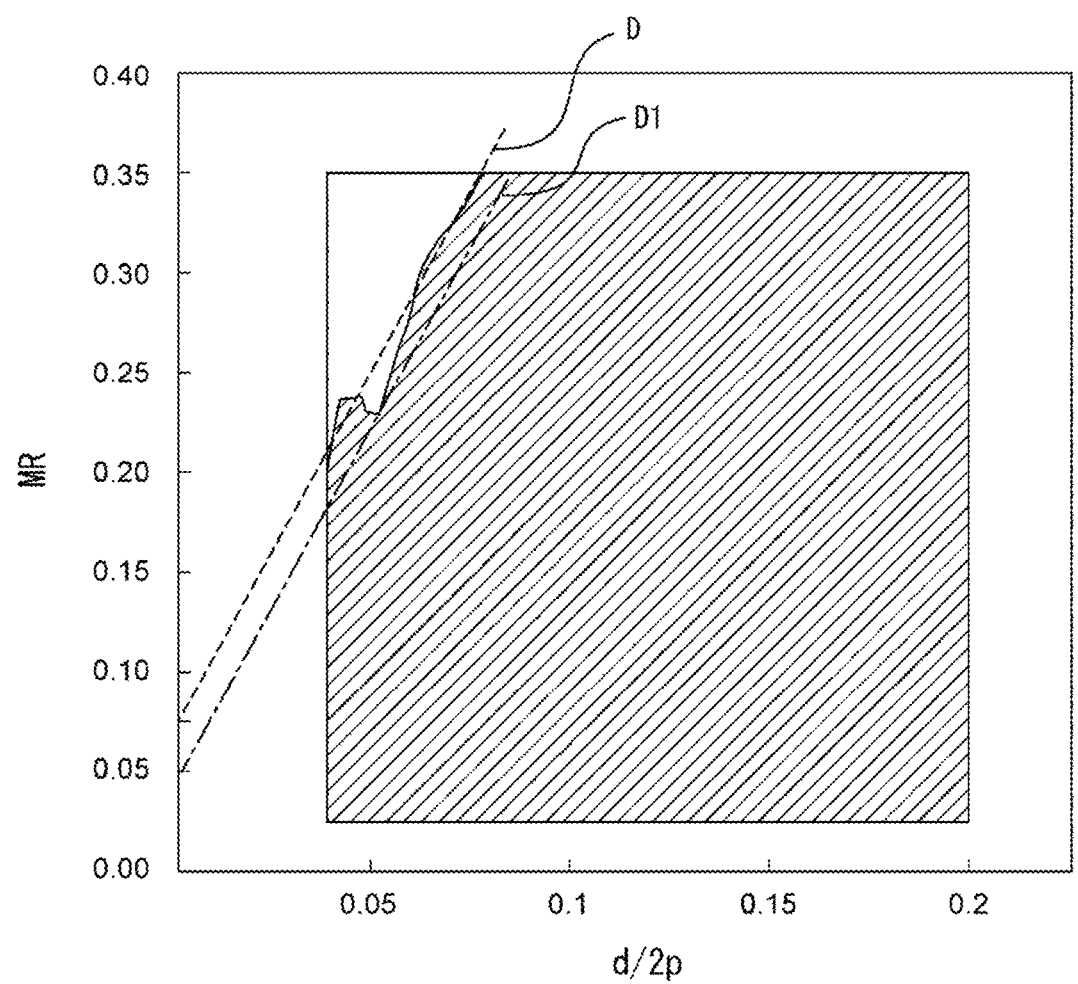
FIG. 21 is a diagram illustrating a relation among d/2p, a metallization ratio MR, and a specific band.

FIG. 21 is a diagram illustrating a relation among d/2p, a metallization ratio MR, and a specific band. In terms of the acoustic wave device described above, various acoustic wave devices having mutually-different d/2p and MR were configured and specific bands were measured. A hatched portion on the right side of a dashed line D in FIG. 21 is a region in which a specific band is about 17% or less. A boundary between the hatched region and a non-hatched region is expressed as MR=3.5(d/2p)+0.075. That is, MR=1.75(d/p)+0.075 is established. Accordingly, MR 1.75 (d/p)+0.075 is preferably established. This case makes it easier to set the specific band to about 17% or less. A region on the right side of MR=3.5(d/2p)+0.05 represented by a dashed-dotted line D1 in FIG. 21 is more preferable. Namely, when MR 1.75(d/p)+0.05 is established, the specific band can be securely set to about 17% or less.

Figure 22:
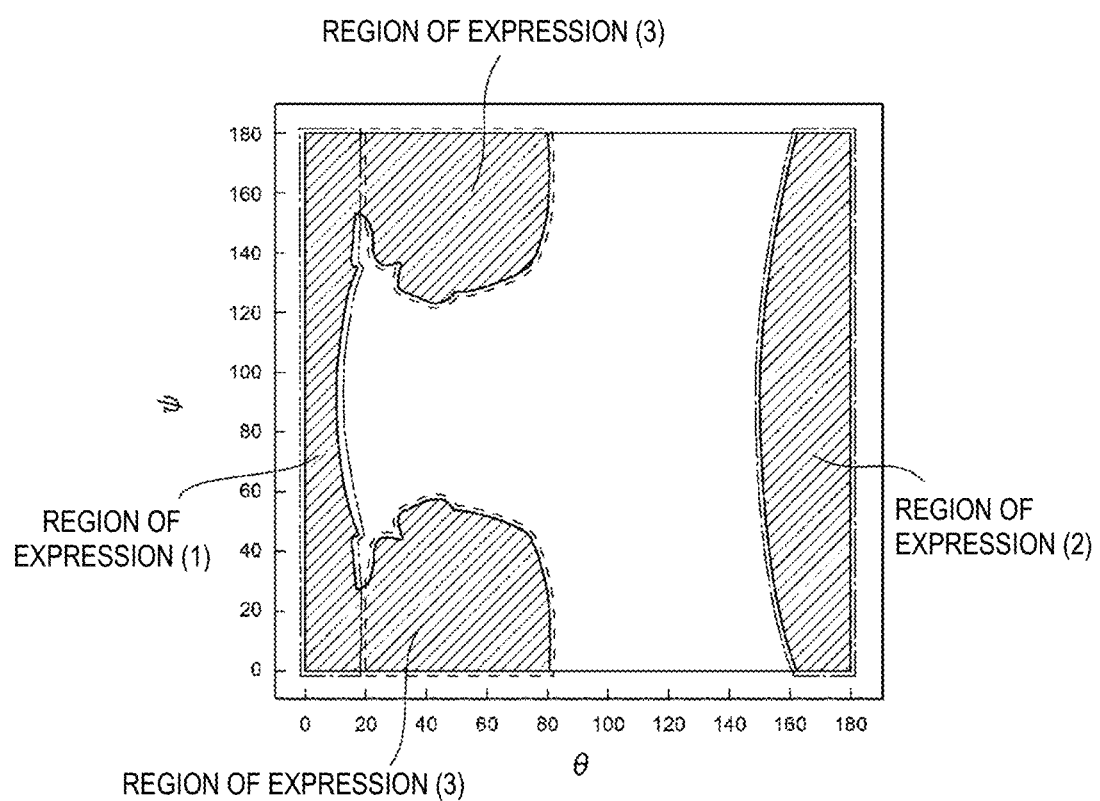
FIG. 22 is a diagram showing a map of a specific band obtained by approximating d/p to 0 as much as possible in $LiNbO_3$ of Euler angles $(0°, θ, ψ)$.

FIG. 22 is a diagram showing a map of a specific band with respect to Euler angles (0°, θ, ψ) of LiNbO$_3$, which is obtained by approximating d/p to 0 as much as possible. Hatched portions in FIG. 22 are regions in which a specific band of at least about 5% or greater can be obtained, and when ranges of the regions are approximated, ranges expressed by the following Expression (1), Expression (2), and Expression (3) are obtained.

(0°±10°, 0° to 20°, arbitrary ψ)  Expression (1)

(0°±10°, 20° to 80°, 0° to 60° $(1-(\theta-50)^2/900)^{1/2}$) or (0°±10°, 20° to 80°, [180°-60° $(1-(\theta-50)^2/900)^{1/2}$] to 180°)  Expression (2)

(0°±10°, [180°-30° $(1-(\psi-90)^2/8100)^{1/2}$] to 180°, arbitrary  Expression (3)

Thus, in the Euler-angle ranges of Expression (1), Expression (2), or Expression (3) above, the specific band can be sufficiently favorably expanded.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a piezoelectric layer that is made of lithium niobate or lithium tantalate; and
    a plurality of pairs of electrodes opposed to each other in a direction intersecting with a thickness direction of the piezoelectric layer; wherein
    a bulk wave in a thickness shear primary mode is used;
    the plurality of pairs of electrodes include at least one pair of first electrodes of a first acoustic wave resonator and at least one pair of second electrodes of a second acoustic wave resonator;
    a direction orthogonal to a longitudinal direction of the second electrodes in the second acoustic wave resonator is inclined at an angle that is greater than 0° and smaller than 360° with respect to a direction orthogonal to a longitudinal direction of the first electrodes in the first acoustic wave resonator; and
    at least one of the first electrodes and the second electrodes include a first busbar, a first electrode finger one end of which is connected to the first busbar, a second busbar that is provided separately from the first busbar, and a second electrode finger one end of which is connected to the second busbar, and the first busbar and the second busbar are non-parallel to each other.

2. The acoustic wave device according to claim 1, wherein the first acoustic wave resonator and the second acoustic wave resonator are connected in series.

3. The acoustic wave device according to claim 1, wherein the first acoustic wave resonator and the second acoustic wave resonator are connected in parallel.

4. The acoustic wave device according to claim 1, wherein the first acoustic wave resonator is provided to a series arm that includes an input end and an output end coupled to each other, and the second acoustic wave resonator is provided to a parallel arm that couples the series arm and a ground potential.

5. The acoustic wave device according to claim 1, wherein the piezoelectric layer includes first and second main surfaces that are opposed to each other; and
    the at least one pair of first electrodes of the first acoustic wave resonator is provided on the first main surface of the piezoelectric layer, and the at least one pair of second electrodes of the second acoustic wave resonator is provided on the second main surface of the piezoelectric layer, the second main surface being on an opposite side to the first main surface.

6. The acoustic wave device according to claim 1, wherein a band pass filter including the first acoustic wave resonator and the second acoustic wave resonator is provided.

7. The acoustic wave device according to claim 6, wherein the band pass filter is a ladder filter, and the first acoustic wave resonator and the second acoustic wave resonator define a series arm resonator or a parallel arm resonator.

8. The acoustic wave device according to claim 7, wherein the first acoustic wave resonator and the second acoustic wave resonator are a pair of acoustic wave resonators including a divided acoustic wave resonator in the ladder filter.

9. An acoustic wave device, comprising:
a piezoelectric layer that is made of lithium niobate or lithium tantalate; and
a plurality of pairs of electrodes opposed to each other in a direction intersecting with a thickness direction of the piezoelectric layer; wherein
a bulk wave in a thickness shear primary mode is used;
the plurality of pairs of electrodes include at least one pair of first electrodes of a first acoustic wave resonator and at least one pair of second electrodes of a second acoustic wave resonator;
a direction orthogonal to a longitudinal direction of the second electrodes in the second acoustic wave resonator is inclined at an angle that is greater than 0° and smaller than 360° with respect to a direction orthogonal to a longitudinal direction of the first electrodes in the first acoustic wave resonator; and
when a thickness of the piezoelectric layer is d and a distance between centers of mutually adjacent electrodes is p, d/p is about 0.24 or lower.

10. An acoustic wave device, comprising:
a piezoelectric layer that is made of lithium niobate or lithium tantalate; and
a plurality of pairs of electrodes opposed to each other in a direction intersecting with a thickness direction of the piezoelectric layer; wherein
a bulk wave in a thickness shear primary mode is used;
the plurality of pairs of electrodes include at least one pair of first electrodes of a first acoustic wave resonator and at least one pair of second electrodes of a second acoustic wave resonator;
a direction orthogonal to a longitudinal direction of the second electrodes in the second acoustic wave resonator is inclined at an angle that is greater than 0° and smaller than 360° with respect to a direction orthogonal to a longitudinal direction of the first electrodes in the first acoustic wave resonator; and
when a thickness of the piezoelectric layer is d, a distance between centers of mutually adjacent electrodes is p, and a metallization ratio of the plurality of pairs of electrodes is MR, MR≤1.75 (d/p)+0.075 is satisfied.

11. An acoustic wave device comprising:
a piezoelectric layer that is made of lithium niobate or lithium tantalate; and
a plurality of pairs of electrodes opposed to each other in a direction intersecting with a thickness direction of the piezoelectric layer; wherein
d/p is about 0.5 or lower when a thickness of the piezoelectric layer is d and a distance between centers of mutually adjacent electrodes among the plurality of pairs of electrodes is p;
the plurality of pairs of electrodes include at least one pair of first electrodes of a first acoustic wave resonator and at least one pair of second electrodes of a second acoustic wave resonator; and
a direction orthogonal to a longitudinal direction of the second electrodes in the second acoustic wave resonator is inclined at an angle that is greater than 0° and smaller than 360° with respect to a direction orthogonal to a longitudinal direction of the first electrodes in the first acoustic wave resonator.

12. The acoustic wave device according to claim 11, wherein the first acoustic wave resonator and the second acoustic wave resonator are connected in series.

13. The acoustic wave device according to claim 11, wherein the first acoustic wave resonator and the second acoustic wave resonator are connected in parallel.

14. The acoustic wave device according to claim 11, wherein the first acoustic wave resonator is provided to a series arm that includes an input end and an output end coupled to each other, and the second acoustic wave resonator is provided to a parallel arm that couples the series arm and a ground potential.

15. The acoustic wave device according to claim 11, wherein
the piezoelectric layer includes first and second main surfaces that are opposed to each other; and
the at least one pair of first electrodes of the first acoustic wave resonator is provided on the first main surface of the piezoelectric layer, and the at least one pair of second electrodes of the second acoustic wave resonator is provided on the second main surface of the piezoelectric layer, the second main surface being on an opposite side to the first main surface.

16. The acoustic wave device according to claim 11, wherein at least one of the first electrodes and the second electrodes include a first busbar, a first electrode finger one end of which is connected to the first busbar, a second busbar that is provided separately from the first busbar, and a second electrode finger one end of which is connected to the second busbar, and the first busbar and the second busbar are non-parallel to each other.

17. The acoustic wave device according to claim 2, wherein a band pass filter including the first acoustic wave resonator and the second acoustic wave resonator is provided.

18. The acoustic wave device according to claim 17, wherein the band pass filter is a ladder filter, and the first acoustic wave resonator and the second acoustic wave resonator define a series arm resonator or a parallel arm resonator.

19. The acoustic wave device according to claim 18, wherein the first acoustic wave resonator and the second acoustic wave resonator are a pair of acoustic wave resonators including a divided acoustic wave resonator in the ladder filter.

20. The acoustic wave device according to claim 11, wherein when the thickness of the piezoelectric layer is d and the distance between centers of mutually adjacent electrodes is p, d/p is about 0.24 or lower.

21. The acoustic wave device according to claim 11, wherein when a metallization ratio of the plurality of pairs of electrodes is MR, MR≤1.75 (d/p)+0.075 is satisfied.

22. The acoustic wave device according to claim 9, wherein the first acoustic wave resonator and the second acoustic wave resonator are connected in series.

23. The acoustic wave device according to claim 9, wherein the first acoustic wave resonator and the second acoustic wave resonator are connected in parallel.

24. The acoustic wave device according to claim 9, wherein the first acoustic wave resonator is provided to a series arm that includes an input end and an output end coupled to each other, and the second acoustic wave resonator is provided to a parallel arm that couples the series arm and a ground potential.

25. The acoustic wave device according to claim 9, wherein
the piezoelectric layer includes first and second main surfaces that are opposed to each other; and
the at least one pair of first electrodes of the first acoustic wave resonator is provided on the first main surface of the piezoelectric layer, and the at least one pair of second electrodes of the second acoustic wave resonator is provided on the second main surface of the piezoelectric layer, the second main surface being on an opposite side to the first main surface.

26. The acoustic wave device according to claim 9, wherein a band pass filter including the first acoustic wave resonator and the second acoustic wave resonator is provided.

27. The acoustic wave device according to claim 10, wherein the first acoustic wave resonator and the second acoustic wave resonator are connected in series.

28. The acoustic wave device according to claim 10, wherein the first acoustic wave resonator and the second acoustic wave resonator are connected in parallel.

29. The acoustic wave device according to claim 10, wherein the first acoustic wave resonator is provided to a series arm that includes an input end and an output end coupled to each other, and the second acoustic wave resonator is provided to a parallel arm that couples the series arm and a ground potential.

30. The acoustic wave device according to claim 10, wherein
the piezoelectric layer includes first and second main surfaces that are opposed to each other; and
the at least one pair of first electrodes of the first acoustic wave resonator is provided on the first main surface of the piezoelectric layer, and the at least one pair of second electrodes of the second acoustic wave resonator is provided on the second main surface of the piezoelectric layer, the second main surface being on an opposite side to the first main surface.

31. The acoustic wave device according to claim 10, wherein a band pass filter including the first acoustic wave resonator and the second acoustic wave resonator is provided.

* * * * *